US010109623B2

(12) United States Patent
Wright et al.

(10) Patent No.: US 10,109,623 B2
(45) Date of Patent: Oct. 23, 2018

(54) DUAL-SERIES VARACTOR EPI

(71) Applicant: TriQuint Semiconductor, Inc., Hillsboro, OR (US)

(72) Inventors: Peter V. Wright, Portland, OR (US); Timothy S. Henderson, Portland, OR (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/142,404

(22) Filed: Apr. 29, 2016

(65) Prior Publication Data

US 2016/0247800 A1 Aug. 25, 2016

Related U.S. Application Data

(63) Continuation-in-part of application No. 14/273,316, filed on May 8, 2014.

(60) Provisional application No. 62/174,573, filed on Jun. 12, 2015.

(51) Int. Cl.
*H01L 27/08* (2006.01)
*H01L 29/66* (2006.01)
*H01L 29/93* (2006.01)
*H01L 25/07* (2006.01)
*H01L 29/20* (2006.01)

(52) U.S. Cl.
CPC .......... *H01L 27/0808* (2013.01); *H01L 25/07* (2013.01); *H01L 29/20* (2013.01); *H01L 29/2003* (2013.01); *H01L 29/66174* (2013.01); *H01L 29/93* (2013.01); *H01L 29/66204* (2013.01); *H01L 2924/0002* (2013.01)

(58) Field of Classification Search
CPC ............... H01L 29/93; H01L 29/66174; H01L 29/7371; H01L 27/0808; H01L 2924/12034; H03B 2201/0208; H03B 2200/004; H03C 2200/0008
See application file for complete search history.

(56) References Cited

U.S. PATENT DOCUMENTS

| 5,055,889 | A | 10/1991 | Beall |
| 6,559,024 | B1 | 5/2003 | Boles et al. |
| 7,323,763 | B2 | 1/2008 | Suzuki et al. |
| 2001/0048120 | A1 | 12/2001 | Shimawaki |
| 2001/0054748 | A1 | 12/2001 | Wikborg et al. |
| 2003/0052388 | A1 | 3/2003 | Mheen et al. |

(Continued)

FOREIGN PATENT DOCUMENTS

| EP | 0619613 A2 | 10/1994 |
| FR | 2321771 A * | 4/1977 |

OTHER PUBLICATIONS

U.S. Appl. No. 15/005,235, filed Jan. 25, 2016.
(Continued)

*Primary Examiner* — Kenneth Parker
*Assistant Examiner* — Nilufa Rahim
(74) *Attorney, Agent, or Firm* — Withrow & Terranova, P.L.L.C.

(57) ABSTRACT

A semiconductor device includes a first varactor diode and a second varactor diode. The second varactor diode is coupled in series with the first varactor diode and vertically disposed over the first varactor diode. By vertically disposing the second varactor diode over the first varactor diode, the space occupied by the pair of varactor diodes can be significantly reduced.

8 Claims, 8 Drawing Sheets

(56) References Cited

U.S. PATENT DOCUMENTS

| | | |
|---|---|---|
| 2004/0155719 A1 | 8/2004 | Suzuki et al. |
| 2005/0156194 A1 | 7/2005 | Ohbu et al. |
| 2007/0132065 A1 | 6/2007 | Lee et al. |
| 2008/0191260 A1 | 8/2008 | De Vreede et al. |
| 2009/0090951 A1 | 4/2009 | Chang et al. |
| 2009/0134960 A1 | 5/2009 | Larson et al. |
| 2009/0195958 A1 | 8/2009 | Vavelidis et al. |
| 2010/0127277 A1 | 5/2010 | Arai et al. |
| 2011/0140240 A1 | 6/2011 | Trivedi |
| 2012/0235731 A1 | 9/2012 | Li et al. |
| 2013/0316512 A1 | 11/2013 | Gunawan et al. |
| 2013/0334570 A1 | 12/2013 | Lin et al. |
| 2014/0054798 A1 | 2/2014 | Bowles |
| 2014/0097434 A1 | 4/2014 | Ellis-Monaghan et al. |
| 2014/0110761 A1 | 4/2014 | Yang et al. |
| 2014/0225225 A1 | 8/2014 | Chung |
| 2014/0273323 A1 | 9/2014 | Kim |
| 2015/0325573 A1 | 11/2015 | Wright et al. |

OTHER PUBLICATIONS

U.S. Appl. No. 14/273,316, filed May 8, 2014.
U.S. Appl. No. 14/995,329, filed Jan. 14, 2016.
U.S. Appl. No. 14/485,532, filed Sep. 12, 2014.
Final Office Action for U.S. Appl. No. 14/273,316, dated Jan. 31, 2017, 17 pages.
Advisory Action for U.S. Appl. No. 14/273,316, dated Mar. 31, 2017, 3 pages.
Non-Final Office Action for U.S. Appl. No. 14/273,316, dated May 18, 2017, 20 pages.
Non-Final Office Action for U.S. Appl. No. 15/245,468, dated May 3, 2017, 19 pages.
Final Office Action for U.S. Appl. No. 14/273,316, dated Sep. 5, 2017, 21 pages.
Non-Final Office Action for U.S. Appl. No. 14/995,329, dated Aug. 18, 2017, 12 pages.
Notice of Allowance and Examiner-Initiated Interview Summary for U.S. Appl. No. 15/245,468, dated Sep. 14, 2017, 11 pages.
Author Unknown,"The Nuts and Bolts of Tuning Varactors," Digi-Key Corporation, Sep. 3, 2009, 15 pages.
Huang, Cong et al., "A GaAs Junction Varactor With a Continuously Tunable Range of 9 : 1 and an $OIP_3$ of 57 dBm," IEEE Electron Device Letters, vol. 31, No. 2, Feb. 2010, pp. 108-110.
Kumar, Tribhuwan, "Varactor theory," SlideShare.net, Published on Dec. 21, 2013, slide 14, http://www.slideshare.net/tribhuwankumar73/varactor-theory, 2 pages.
Poole, Ian, "Varactor Abrupt & Hyperabrupt Diodes," Radio-Electronics.com, Date Accessed: Feb. 9, 2016, 5 pages, http://www.radio-electronics.com/info/data/semicond/varactor-varicap-diodes/hyperabrupt.php.
Restriction Requirement for U.S. Appl. No. 14/273,316, dated Feb. 2, 2015, 8 pages.
Non-Final Office Action for U.S. Appl. No. 14/273,316, dated Apr. 20, 2015, 14 pages.
Final Office Action for U.S. Appl. No. 14/279,316, dated Nov. 27, 2015, 18 pages.
Non-Final Office Action for U.S. Appl. No. 14/485,532, dated Nov. 9, 2015, 17 pages.
Notice of Allowance for U.S. Appl. No. 14/485,532, dated May 25, 2016, 10 pages.
Non-Final Office Action for U.S. Appl. No. 15/005,235, dated Jul. 29, 2016, 13 pages.
Non-Final Office Action for U.S. Appl. No. 14/273,316, dated Sep. 2, 2016, 14 pages.
Advisory Action for U.S. Appl. No. 14/273,316, dated Nov. 13, 2017, 2 pages.
Preliminary Search Report and Written Opinion for French Patent Application No. 1553377, dated Aug. 21, 2017, 11 pages.
Notice of Non-Compliant Amendment for U.S. Appl. No. 14/273,316, dated Dec. 21, 2017, 4 pages.
Final Office Action for U.S. Appl. No. 14/995,329, dated Dec. 6, 2017, 14 pages.
Advisory Action for U.S. Appl. No. 14/995,329, dated Feb. 14, 2018, 3 pages.
Non-Final Office Action for U.S. Appl. No. 14/273,316, dated May 17, 2018, 35 pages.
Non-Final Office Action for U.S. Appl. No. 14/995,329, dated Jul. 27, 2018, 24 pages.
Official Letter for Taiwanese Patent Application No. 104111585, dated Jul. 13, 2018, 39 pages.

\* cited by examiner

DUAL-SERIES VARACTOR EPI

RELATED APPLICATIONS

This application claims the benefit of U.S. provisional patent application No. 62/174,573, filed Jun. 12, 2015, and is a continuation-in-part of U.S. patent application Ser. No. 14/273,316, filed May 8, 2014, the disclosures of which are incorporated herein by reference in their entirety.

FIELD OF THE DISCLOSURE

The present disclosure relates to varactors, and in particular to varactor diodes.

BACKGROUND

A varactor is an electronic component with a capacitance that changes in response to an applied bias voltage. While there are many different types of varactors, an exemplary varactor diode 10 is shown in FIGS. 1A and 1B. The exemplary varactor diode 10 is operated by coupling the varactor diode 10 between a bias voltage $V_{BIAS}$ and ground. Specifically, the varactor diode 10 is coupled such that a cathode of the varactor diode 10 is coupled to the bias voltage $V_{BIAS}$ while an anode of the varactor diode 10 is coupled to ground. An input node 12A may be coupled to the cathode of the varactor diode 10, while an output node 12B may be coupled to the anode of the varactor diode 10. As the bias voltage $V_{BIAS}$ is changed, a capacitance $C_D$ between the input node 12A and the output node 12B also changes. This is due to the fact that the bias voltage $V_{BIAS}$, which is a reverse-bias voltage, controls a width $W_{DR}$ of a depletion region within a P-N junction of the varactor diode 10, as shown in FIG. 1B. Specifically, the bias voltage $V_{BIAS}$ is directly proportional to the width $W_{DR}$ of the depletion region, such that as the bias voltage $V_{BIAS}$ increases, the width $W_{DR}$ of the depletion region also increases, and vice-versa. The width $W_{DR}$ of the depletion region is in turn inversely proportional to the capacitance $C_D$ across the varactor diode 10, such that as the width $W_{DR}$ of the depletion region increases, the capacitance $C_D$ across the varactor diode 10 decreases. Accordingly, the bias voltage $V_{BIAS}$ is able to control the capacitance $C_D$ across the varactor diode 10.

Varactors are used in a variety of different applications. For example, many varactors are currently used in radio frequency (RF) circuitry such as RF front-end circuitry. In such applications, a time-varying RF signal is generally applied across the varactor diode 10. The RF signal may modulate the capacitance $C_D$ of the varactor diode 10 due to the same mechanism of action described above with respect to the bias voltage $V_{BIAS}$, which may be undesirable in many situations. In order to counteract this modulation effect, multiple varactor diodes 10 may be coupled in series between the input node 12A and the output node 12B, as shown in FIG. 2. Specifically, FIG. 2 shows a number of varactor diodes 10A-10H coupled in an alternating-polarity configuration such that a cathode of a first varactor diode 10A is coupled to the input node 12A, an anode of the first varactor diode 10A is coupled to an anode of a second varactor diode 10B, a cathode of the second varactor diode 10B is coupled to a cathode of a third varactor diode 10C, an anode of the third varactor diode 10C is coupled to an anode of a fourth varactor diode 10D, a cathode of the fourth varactor diode 10D is coupled to a cathode of a fifth varactor diode 10E, an anode of the fifth varactor diode 10E is coupled to an anode of a sixth varactor diode 10F, a cathode of the sixth varactor diode 10F is coupled to a cathode of a seventh varactor diode 10G, an anode of the seventh varactor diode 10G is coupled to an anode of an eighth varactor diode 10H, and a cathode of the eighth varactor diode 10H is coupled to the output node 12B. The bias voltage $V_{BIAS}$ is coupled to the cathode of the first varactor diode 10A via a first bias resistor $R_{B1}$, coupled to the cathode of the second varactor diode 10B and the third varactor diode 10C via a second bias resistor $R_{B2}$, coupled to the cathode of the fourth varactor diode 10D and the fifth varactor diode 10E via a third bias resistor $R_{B3}$, and coupled to the cathode of the sixth varactor diode 10F and the seventh varactor diode 10G via a fourth bias resistor $R_{B4}$. Further, the anode of the first varactor diode 10A and the second varactor diode 10B are coupled to ground via a fifth bias resistor $R_{B5}$, the anode of the third varactor diode 10C and the fourth varactor diode 10D are coupled to ground via a sixth bias resistor $R_{B6}$, the anode of the fifth varactor diode 10E and the sixth varactor diode 10F are coupled to ground via a seventh bias resistor $R_{B7}$, and the anode of the seventh varactor diode 10G and the eighth varactor diode 10H are coupled to ground via an eighth bias resistor $R_{B8}$. Because each one of the varactor diodes 10A-10H are essentially coupled in a reverse-bias configuration between the bias voltage $V_{BIAS}$ and ground, each one of the varactor diodes 10A-10H will vary the capacitance $C_D$ thereof in response to the bias voltage $V_{BIAS}$ as discussed above. Further, due to the fact that the varactor diodes 10A-10H are stacked in an alternating-polarity configuration, an increase in the capacitance of one of the diodes due to an RF signal placed across the varactor diodes 10A-10H is counteracted by a decrease in the capacitance of a corresponding reverse-connected varactor diode such that the net effect of an applied RF signal on the overall capacitance of the varactor diodes 10A-10H is minimal.

Generally, it is desirable for the capacitance of a varactor diode to change as quickly as possible in response to a change in the bias voltage $V_{BIAS}$. The response over time of a resistor-capacitor (RC) circuit such as a varactor to a given voltage function is described by Equation (1):

$$\tau = RC \qquad (1)$$

where $\tau$ is the time constant of the circuit, R is a total resistance of the circuit as seen from the source of the voltage, and C is a total capacitance as seen from the source of the voltage. Higher values of $\tau$ are associated with an increased delay between an applied voltage and a change in the capacitance of the circuit. Accordingly, the larger the time constant associated with a varactor diode, the longer the time delay associated with a change in the bias voltage VBIAS and a corresponding change in the capacitance of the varactor diode.

In order to reduce the propagation of RF signals towards the bias voltage $V_{BIAS}$ and ground in the circuitry shown in FIG. 2, the bias resistors $R_{B1}$-$R_{B8}$ must generally be kept quite large, on the order of 20 kΩ and larger. Further, due to the fact that each one of the varactor diodes 10A-10H are essentially coupled in parallel between the bias voltage $V_{BIAS}$ and ground, the combined capacitance of the varactor diodes as seen by the bias voltage $V_{BIAS}$ is the sum of each one of the varactor diodes 10A-10H. Accordingly, the combination of the resistance and the capacitance RC seen by the bias voltage VBIAS is quite large, resulting in a large time constant $\tau$, and thus a relatively slow response time of the varactor circuitry shown in FIG. 2.

Accordingly, FIG. 3 shows an alternative configuration for the varactor diodes 10A-10H. Specifically, FIG. 3 shows the varactor diodes coupled in series between the input node 12A and the output node 12B, such that the cathode of the first varactor diode 10A is coupled to the input node, the anode of the eighth varactor diode 10H is coupled to the output node 12B, and the remaining diodes are coupled between the first varactor diode 10A and the eighth varactor diode 10H in an anode-to-cathode configuration as shown. The bias voltage $V_{BIAS}$ is coupled to the cathode of the first varactor diode 10A via a first biasing resistor $R_{B1}$ and coupled to the anode of the eighth varactor diode 10H via a second biasing resistor $R_{B2}$. The resistance seen from the bias voltage $V_{BIAS}$ is thus significantly decreased compared to the circuitry shown in FIG. 2. Further, because the varactor diodes 10A-10C are coupled in series, the effective value thereof is calculated as shown in Equation (2):

$$\frac{1}{\frac{1}{C_1}+\frac{1}{C_2}+\frac{1}{C_3}\ldots} \quad (2)$$

Accordingly, both the resistance and the capacitance RC associated with the circuitry shown in FIG. 3 is significantly reduced compared to that shown in FIG. 2, which results in significant reductions in the time constant τ thereof. Such a performance increase in the response time of the varactor diode circuitry shown in FIG. 3 comes at the expense of the ability of the circuitry to cancel the effects of RF signal modulation as in the alternating-polarity circuitry discussed above with respect to FIG. 2.

Conventionally, varactor diode structures such as those described above with respect to FIGS. 2 and 3 have been made by placing a number of co-planar varactor diodes 10A-10H next to one other on a substrate, as shown in FIG. 4. Each one of the diodes consumes area on the substrate, and thus the area required for the diodes may become quite large for circuitry requiring multiple stacked varactor diodes such as that shown in FIGS. 2 and 3. While a dual-stack varactor for alternating-polarity applications such as that shown in FIG. 2 has been described in co-pending and co-assigned U.S. patent application Ser. No. 14/273,316, the contents of which are hereby incorporated by reference in their entirety, series-coupled varactor diodes such as those shown in FIG. 2 have thus far been limited to single-stack solutions, resulting in the consumption of a relatively large area on a substrate.

Accordingly, there is a need for stacked varactor circuitry for series-connected varactor diodes with a reduced area.

SUMMARY

The present disclosure relates to varactors, and in particular to varactor diodes. In one embodiment, a semiconductor device includes a first varactor diode and a second varactor diode. The second varactor diode is coupled in series with the first varactor diode and vertically disposed over the first varactor diode. By vertically disposing the second varactor diode over the first varactor diode, the space occupied by the pair of varactor diodes can be significantly reduced.

In one embodiment, the first varactor diode includes a first cathode contact layer, a first cathode layer over the first cathode contact layer, a first varactor layer over the first cathode layer, and a first anode contact layer over the first varactor layer. Further, the first varactor diode may include a cathode contact on the first cathode contact layer and an anode contact on the first anode contact layer.

The second varactor diode may include a second cathode contact layer over the first anode contact layer, a second cathode layer over the second cathode contact layer, a second varactor layer over the second cathode layer, and a second anode contact layer over the varactor layer. Further, the second varactor diode may include a cathode contact on the second cathode contact layer and an anode contact on the second anode contact layer.

A first etch stop layer may be between the first cathode contact layer and the first cathode layer. A second etch stop layer may be between the first anode contact layer and the second cathode contact layer. A third etch stop layer may be between the second cathode contact layer and the second cathode layer.

In one embodiment, the first varactor diode includes a first anode contact layer, a first anode layer over the first anode contact layer, a first varactor layer over the first anode layer, and a first cathode contact layer over the first varactor layer. Further, the first varactor diode may include an anode contact on the first anode contact layer and a cathode contact on the first cathode contact layer.

The second varactor diode may include a second anode contact layer over the first cathode contact layer, a second anode layer over the second anode contact layer, a second varactor layer over the second anode layer, and a second cathode contact layer over the second varactor layer. Further, the second varactor diode may include an anode contact on the second anode contact layer and a cathode contact on the second cathode contact layer.

A first etch stop layer may be between the first anode contact layer and the first anode layer. A second etch stop layer may be between the first cathode contact layer and the second anode contact layer. A third etch stop layer may be between the second anode contact layer and the second anode layer.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 5:
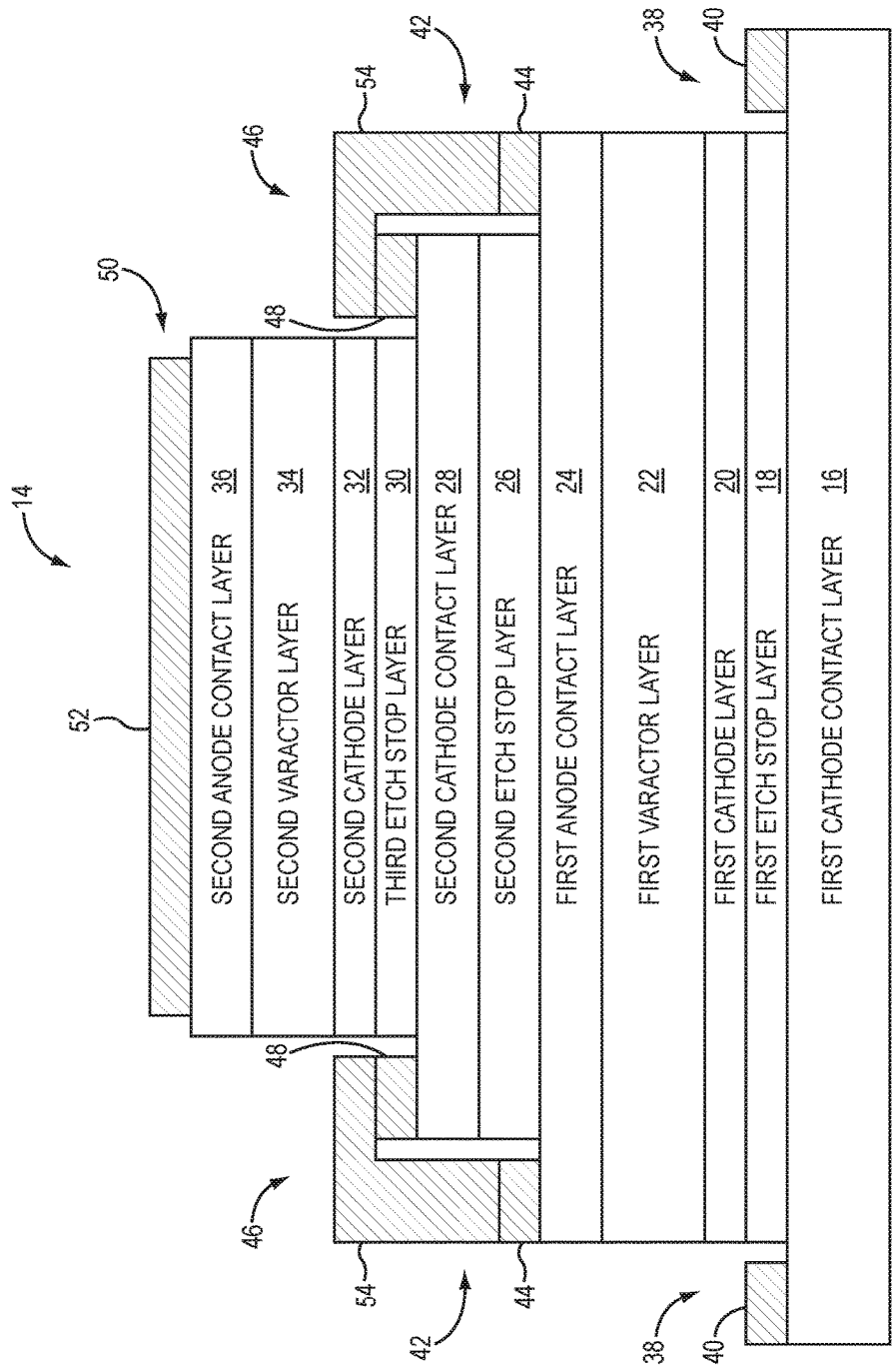
FIG. 5 shows a dual-stack varactor according to one embodiment of the present disclosure.

FIG. 5 shows a dual-stack varactor 14 according to one embodiment of the present disclosure. The dual-stack varactor 14 includes a first cathode contact layer 16, a first etch stop layer 18 over the first cathode contact layer 16, a first cathode layer 20 over the first etch stop layer 18, a first varactor layer 22 over the first cathode layer 20, a first anode contact layer 24 over the first varactor layer 22, a second etch stop layer 26 over the first anode contact layer 24, a second cathode contact layer 28 over the second etch stop layer 26, a third etch stop layer 30 over the second cathode contact layer 28, a second cathode layer 32 over the third etch stop layer 30, a second varactor layer 34 over the second cathode layer 32, and a second anode contact layer 36 over the second varactor layer 34.

The dual-stack varactor 14 is formed as a number of different mesas in order to allow contacts to be placed on the various layers therein. The first cathode contact layer 16 forms a first mesa 38 on top of which a first ohmic contact 40, which may be separated into a pair of ohmic contacts, is located. The first ohmic contact(s) 40 effectively forms a cathode contact of a first varactor diode in the dual-stack varactor 14. The first etch stop layer 18, the first cathode layer 20, the first varactor layer 22, and the first anode contact layer 24 form a second mesa 42 on top of which a second ohmic contact 44, which may be separated into a pair of ohmic contacts, is located. The second ohmic contact(s) 44 effectively form an anode contact of the first varactor diode in the dual-stack varactor 14. The second etch stop layer 26 and the second cathode contact layer 28 form a third mesa 46 on top of which a third ohmic contact 48, which may be separated into a pair of ohmic contacts, is located. The third ohmic contact(s) 48 effectively form a cathode contact of a second varactor diode in the dual-stack varactor 14. Finally, the third etch stop layer 30, the second cathode layer 32, the second varactor layer 34, and the second anode contact layer 36 form a fourth mesa 50 on top of which a fourth ohmic contact 52 is located. The fourth ohmic contact 52 effectively forms an anode contact of the second varactor diode in the dual-stack varactor 14. A metallization layer 54 connects the second ohmic contact(s) 44 to the third ohmic contact(s) 48. Accordingly, a pair of series-connected varactor diodes are formed between the first ohmic contact(s) 40 and the fourth ohmic contact 52.

Figure 1A:
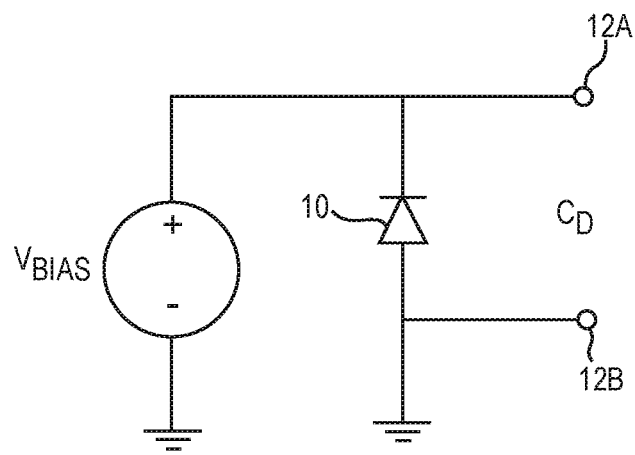
FIGS. 1A and 1B show a single varactor diode.
Figure 1B:
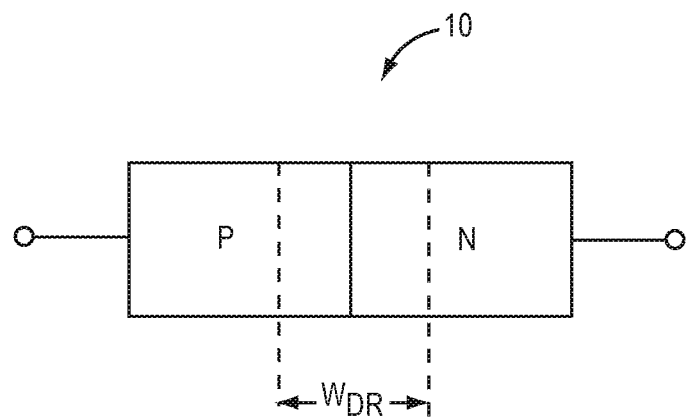
Figure 2:
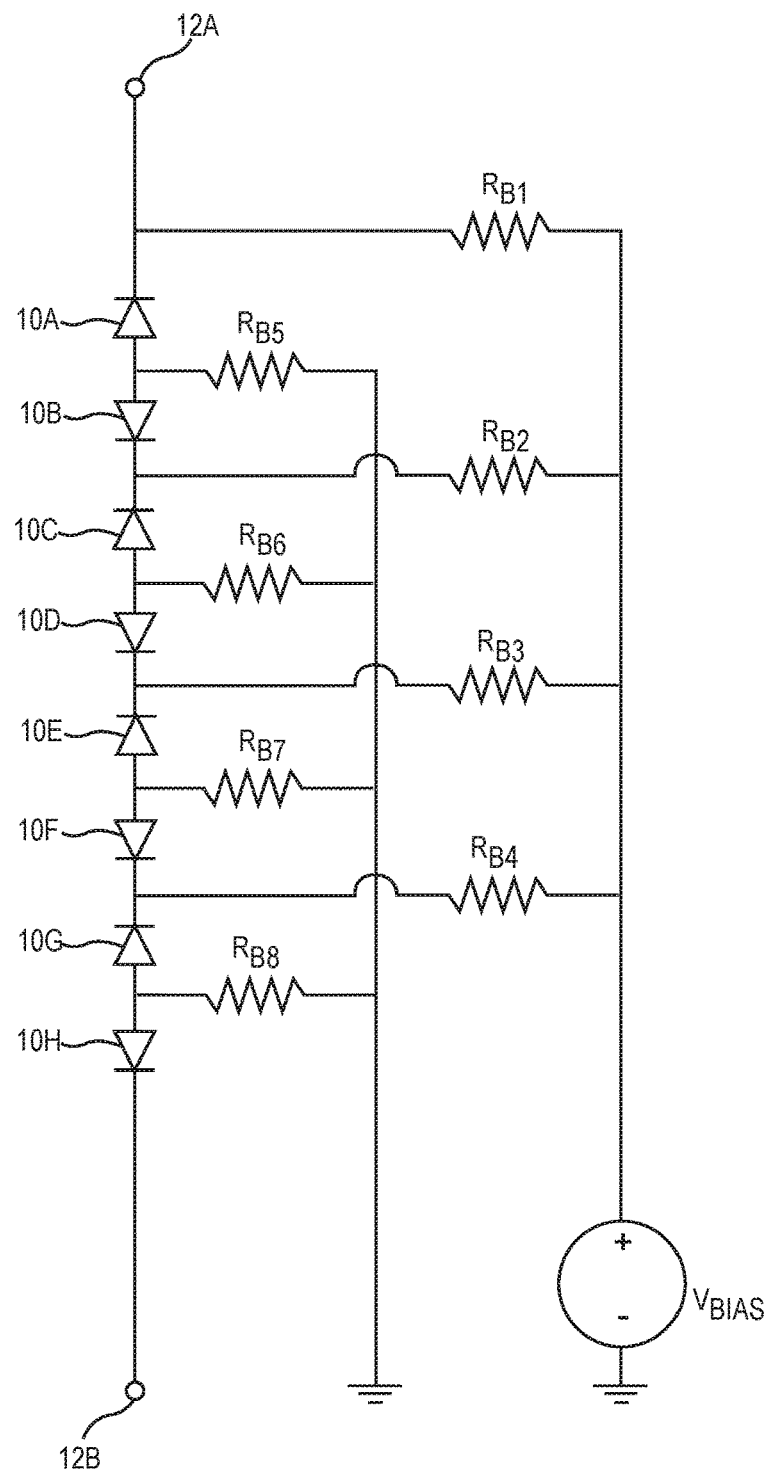
FIG. 2 shows a number of varactor diodes stacked in an alternating-polarity configuration.
Figure 3:
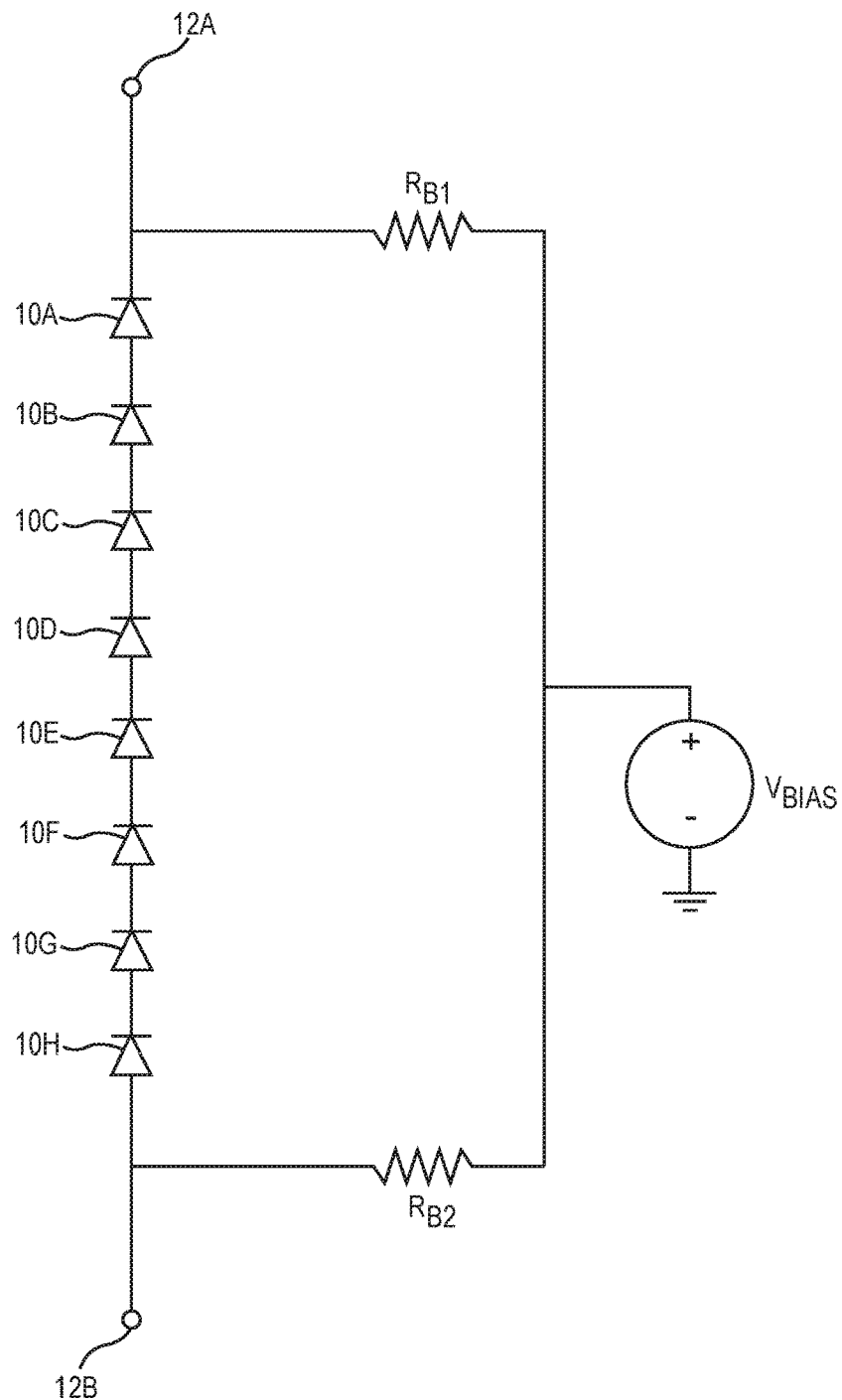
FIG. 3 shows a number of varactor diodes connected in series.
Figure 4:
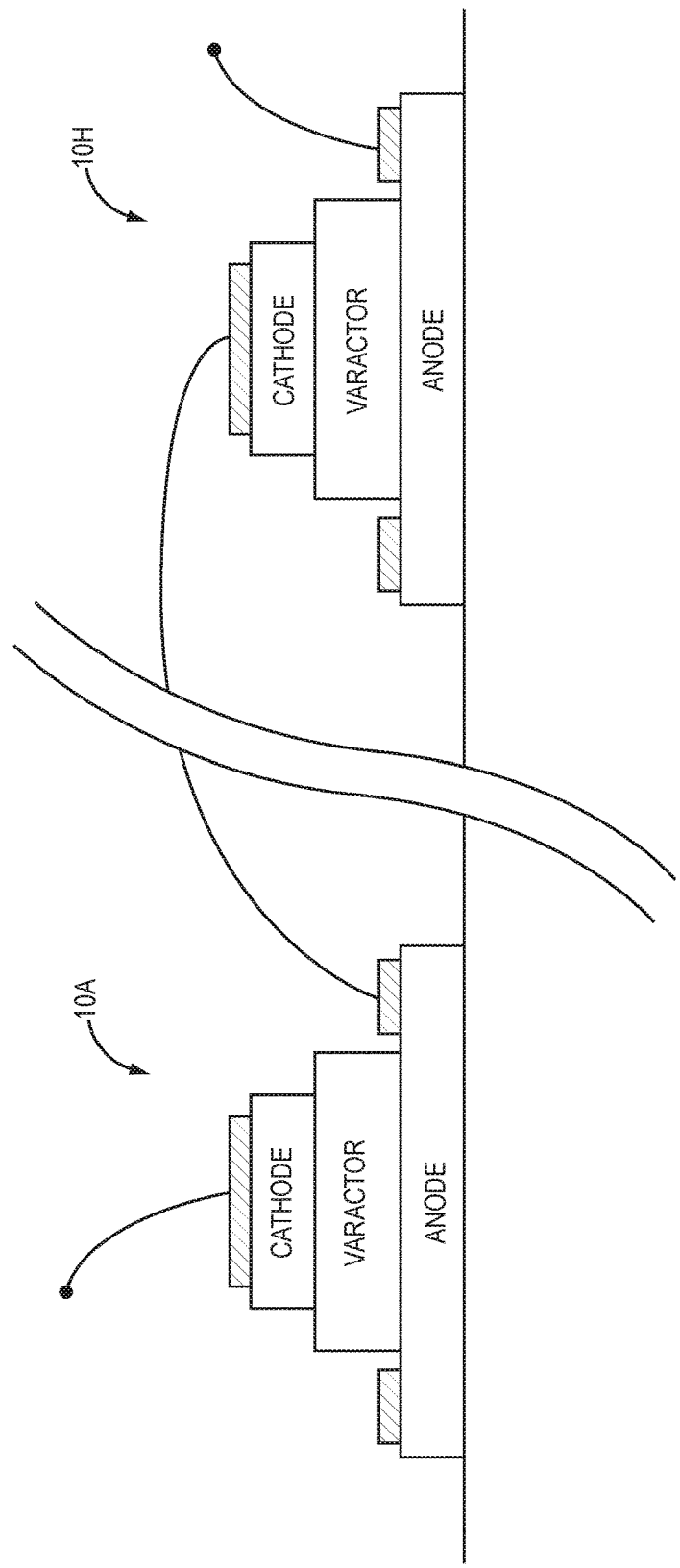
FIG. 4 shows the physical layout of a number of varactor diodes coupled in series.

Due to the fact that two varactor diodes 10 are vertically disposed in the dual-stack varactor 14 with a footprint that is comparable to a single-stack varactor, the number of varactor diodes per unit area can effectively be doubled when using the dual-stack varactor 14. Accordingly, significant reductions in the size of circuitry such as that shown in FIGS. 2 and 3 can be achieved. Such size reductions may result in similar reductions in the cost of the circuitry.

In one embodiment, the first cathode contact layer 16 is a heavily doped p-layer with a thickness between about 0.4 µm and 2.0 µm and a doping concentration between about $1 \times 10^{19}$ $cm^{-3}$ and $4 \times 10^{19}$ $cm^{-3}$. The first etch stop layer 18 may be a heavily doped p-layer with a thickness between about 0.005 µm and 0.03 µm and a doping concentration between about $1 \times 10^{19}$ $cm^{-3}$ and $4 \times 10^{19}$ $cm^{-3}$. The first cathode layer 20 may be a heavily doped p-layer with a thickness between about 0.05 µm and 0.2 µm and a doping concentration between about $1 \times 10^{19}$ $cm^{-3}$ and $4 \times 10^{19}$ $cm^{-3}$. The first varactor layer 22 may be a lightly doped n-layer with a thickness between about 0.5 µm and 2.0 µm and a doping concentration between about $1 \times 10^{15}$ $cm^{-3}$ and $1 \times 10^{17}$ $cm^{-3}$. The first anode contact layer 24 may be a heavily doped n-layer with a thickness between about 0.1 µm and 0.5 µm and a doping concentration between about $1 \times 10^{18}$ $cm^{-3}$ and $5 \times 10^{18}$ $cm^{-3}$. The second etch stop layer 26 may be a n+ layer with a thickness between about 0.005 µm and 0.03 µm and a doping concentration between about $1 \times 10^{18}$ $cm^{-3}$ and $5 \times 10^{18}$ $cm^{-3}$. The second cathode contact layer 28 may be a heavily-doped p-layer with a thickness between about 0.05 µm and 0.2 µm and a doping concentration between about $1 \times 10^{19}$ $cm^{-3}$ and $4 \times 10^{19}$ $cm^{-3}$. The third etch stop layer 30 may be a heavily-doped p-layer with a thickness between about 0.005 µm and 0.03 µm and a doping concentration between about $1 \times 10^{19}$ $cm^{-3}$ and $4 \times 10^{19}$ $cm^{-3}$. The second cathode layer 32 may be a heavily doped p-layer with a thickness between about 0.05 µm and 0.2 µm and a doping concentration between about $1 \times 10^{19}$ $cm^{-3}$ and $4 \times 10^{19}$ $cm^{-3}$. The second varactor layer 34 may be a lightly-doped n-layer with a thickness between about 0.5 µm and 2.0 µm and a doping concentration between about $1 \times 10^{15}$ $cm^{-3}$ and $1 \times 10^{17}$ $cm^{-3}$. The second anode contact layer 36 may be a heavily-doped n-layer with a thickness between about 0.05 µm and 0.2 µm and a doping concentration between about $1 \times 10^{18}$ $cm^{-3}$ and $5 \times 10^{18}$ $cm^{-3}$. The n-dopants used in the n-layers described above may include silicon (Si), tellurium (Te), or the like. The p-dopants used in the p-layers described above may include carbon (C), beryllium (Be), zinc (Zn), or the like. Notably, the foregoing thicknesses and doping concentration for the various layers in the dual-stack varactor 14 are merely illustrative. Any number of suitable thicknesses or doping concentrations may be used for the layers in the dual-stack varactor 14 without departing from the principles of the present disclosure.

In one embodiment, the first cathode contact layer 16, the first cathode layer 20, the varactor layer 22, the first anode contact layer 24, the second cathode contact layer 28, the second cathode layer 32, the second varactor layer 34, and the second anode contact layer 36 are all gallium arsenide (GaAs). The first etch stop layer 18, the second etch stop layer 26, and the third etch stop layer 30 may be aluminum gallium arsenide (AlGaAs) or indium gallium arsenide (InGaAs). The first ohmic contact(s) 40 may comprise titanium-platinum-gold (TiPtAu). The second ohmic contact(s) 44 may comprise gold-germanium-nickel-gold (AuGeNiAu). The third ohmic contact(s) 48 may comprise titanium-platinum-gold (TiPtAu). The fourth ohmic contact 52 may comprise titanium-tungsten (TiW). Finally, the metallization layer 54 may comprise titanium/gold (Ti/Au). Notably, the foregoing materials for the dual-stack varactor 14 are merely illustrative, and any number of different materials may be used for the various layers without departing from the principles of the present disclosure.

Figure 6:
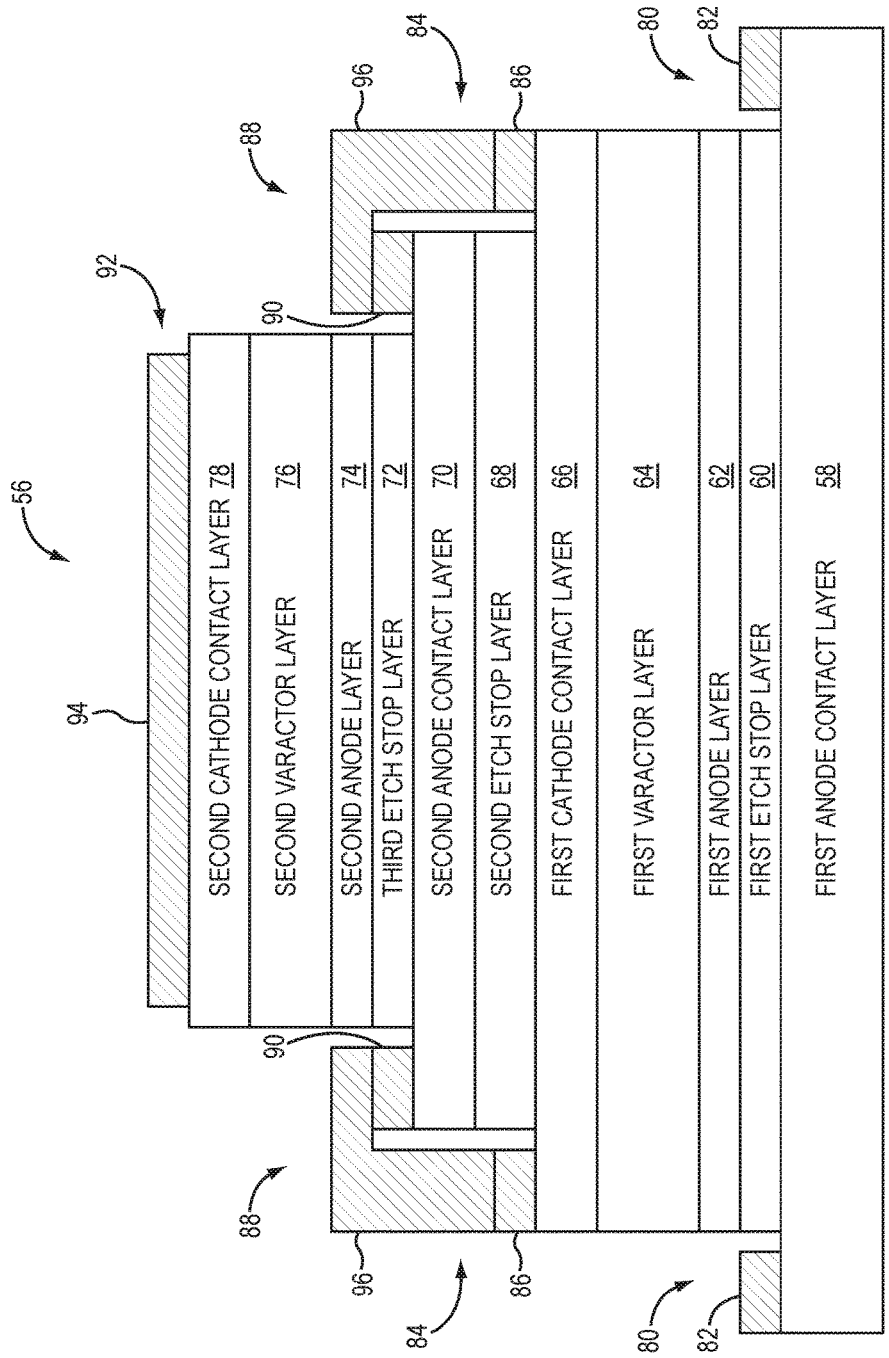
FIG. 6 shows a dual-stack varactor according to an additional embodiment of the present disclosure.

FIG. 6 shows a dual-stack varactor 56 according to an additional embodiment of the present disclosure. The dual-stack varactor 56 shown in FIG. 6 is substantially similar to that shown in FIG. 5, except that the varactor diodes in the dual-stack varactor 56 are reversed. Accordingly, the dual-stack varactor 56 includes a first anode contact layer 58, a first etch stop layer 60 over the first anode contact layer 58, a first anode layer 62, a first varactor layer 64 over the first anode layer 62, a first cathode contact layer 66 over the first varactor layer 64, a second etch stop layer 68 over the first cathode contact layer 66, a second anode contact layer 70 over the second etch stop layer 68, a third etch stop layer 72 over the second anode contact layer 70, a second anode layer 74 over the third etch stop layer 72, a second varactor layer 76 over the second anode layer 74, and a second cathode contact layer 78 over the second varactor layer 76.

The dual-stack varactor 56 is formed as a number of different mesas in order to allow contacts to be placed on the various layers therein. The first anode contact layer 58 forms a first mesa 80 on top of which a first ohmic contact 82, which may be separated into a pair of ohmic contacts, is located. The first ohmic contact(s) 82 effectively forms an anode contact of a first varactor diode in the dual-stack varactor 56. The first etch stop layer 60, the first anode layer 62, the first varactor layer 64, and the first cathode contact layer 66 form a second mesa 84 on top of which a second ohmic contact 86, which may be separated into a pair of ohmic contacts, is located. The second ohmic contact(s) 86 effectively forms a cathode contact of the first varactor diode. The second etch stop layer 68 and the second anode contact layer 70 form a third mesa 88 on top of which a third ohmic contact 90, which may be separated into a pair of ohmic contacts, is located. The third ohmic contact(s) 90 effectively forms an anode contact of a second varactor diode in the dual-stack varactor 56. The third etch stop layer 72, the second anode layer 74, the second varactor layer 76, and the second cathode contact layer 78 form a fourth mesa 92 on top of which a fourth ohmic contact 94 is located. The fourth ohmic contact 94 effectively forms a cathode contact of the second varactor diode. A metallization layer 96 connects the second ohmic contact(s) 86 to the third ohmic contact(s) 90. Accordingly, a pair of series-connected varactor diodes are formed between the first ohmic contact(s) 82 and the fourth ohmic contact 94.

Due to the fact that two varactor diodes are vertically disposed in the dual-stack varactor 56 with a footprint that is comparable to a single-stack varactor, the number of varactor diodes per unit area can effectively be doubled when using the dual-stack varactor 56. Accordingly, significant reductions in the size of circuitry such as that shown in FIGS. 2 and 3 can be achieved. Such size reductions may result in similar reductions in the cost of the circuitry.

In one embodiment, the first anode contact layer 58 is a heavily doped n-layer with a thickness between about 0.4 µm and 2.0 µm and a doping concentration between about $1\times10^{18}$ cm$^{-3}$ and $5\times10^{18}$ cm$^{-3}$. The first etch stop layer 60 may be a heavily doped n-layer with a thickness between about 0.005 µm and 0.03 µm and a doping concentration between about $1\times10^{18}$ cm$^{-3}$ and $5\times10^{18}$ cm$^{-3}$. The first anode layer 62 may be a heavily doped n-layer with a thickness between about 0.05 µm and 0.2 µm and a doping concentration between about $1\times10^{18}$ cm$^{-3}$ and $5\times10^{18}$ cm$^{-3}$. The first varactor layer 64 may be a lightly doped n-layer with a thickness between about 0.5 µm and 2.0 µm and a doping concentration between about $1\times10^{15}$ cm$^{-3}$ and $1\times10^{17}$ cm$^{-3}$. The first cathode contact layer 66 may be a heavily doped p-layer with a thickness between about 0.05 µm and 0.2 µm and a doping concentration between about $1\times10^{19}$ cm$^{-3}$ and $4\times10^{19}$ cm$^{-3}$. The second etch stop layer 68 may be a p+ layer with a thickness between about 0.005 µm and 0.03 µm and a doping concentration between about $1\times10^{19}$ cm$^{-3}$ and $4\times10^{19}$ cm$^{-3}$. The second anode contact layer 70 may be a heavily doped n-layer with a thickness between about 0.05 µm and 0.5 µm and a doping concentration between about $1\times10^{18}$ cm$^{-3}$ and $5\times10^{18}$ cm$^{-3}$. The third etch stop layer 72 may be a heavily doped n-layer with a thickness between about 0.005 µm and 0.03 µm and a doping concentration between about $1\times10^{18}$ cm$^{-3}$ and $5\times10^{18}$ cm$^{-3}$. The second anode layer 74 may be a heavily doped n-layer with a thickness between about 0.05 µm and 0.2 µm and a doping concentration between about $1\times10^{18}$ cm$^{-3}$ and $5\times10^{18}$ cm$^{-3}$. The second varactor layer 76 may be a lightly doped n-layer with a thickness between about 0.5 µm and 2.0 µm and a doping concentration between about $1\times10^{15}$ cm$^{-3}$ and $1\times10^{17}$ cm$^{-3}$. Finally, the second cathode contact layer 78 may be a heavily doped p-layer with a thickness between about 0.05 µm and 0.2 µm and a doping concentration between about $1\times10^{19}$ cm$^{-3}$ and $4\times10^{19}$ cm$^{-3}$. Notably, the foregoing thicknesses and doping concentrations for the various layers in the dual stack varactor 56 are merely illustrative. Any number of suitable thicknesses or doping concentrations may be used for the layers in the dual-stack varactor 56 without departing from the principles of the present disclosure.

In one embodiment, the first anode contact layer 58, the first anode layer 62, the first varactor layer 64, the first cathode contact layer 66, the second anode contact layer 70, the second anode layer 74, the second varactor layer 76, and the second cathode contact layer comprise gallium arsenide (GaAs). The first etch stop layer 60, the second etch stop layer 68, and the third etch stop layer 72 may be aluminum gallium arsenide (AlGaAs) or indium gallium arsenide (InGaAs). The first ohmic contact(s) 82 may comprise gold-germanium-nickel-gold (AuGeNiAu). The second ohmic contact(s) 86 may comprise titanium-platinum-gold (TiPtAu). The third ohmic contact(s) 90 may comprise gold-germanium-nickel-gold (AuGeNiAu). The fourth ohmic contact 94 may comprise titanium-tungsten (TiW). Notably, the foregoing materials for the dual-stack varactor 56 are merely illustrative, and any number of different materials may be used for the various layers without departing from the principles of the present disclosure.

While FIGS. 5 and 6 illustrate only two varactor diodes vertically stacked with respect to one another, the principles of the present disclosure may be used to stack any number of varactor diodes on top of one another.

Figure 7:
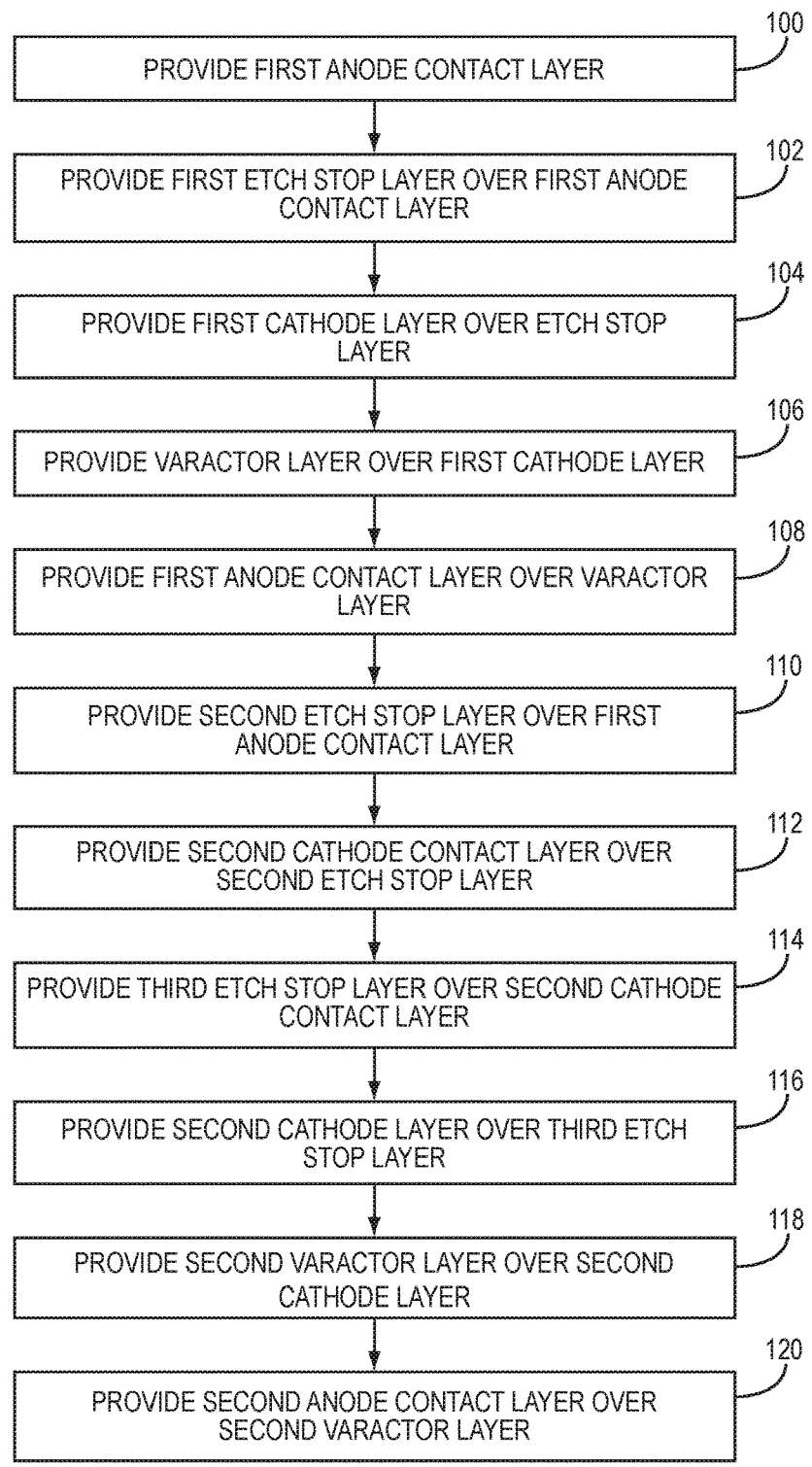
FIG. 7 is a flow diagram illustrating a method for manufacturing an epitaxial stack for a dual-stack varactor according to one embodiment of the present disclosure.

FIG. 7 is a flow diagram illustrating a method for manufacturing the epitaxial stack making up the dual-stack varactor 14 shown in FIG. 5. The epitaxial stack of the dual stack varactor 56 shown in FIG. 6 may be made by a similar process. First, the first anode contact layer 16 is provided (step 100). The first etch stop layer 18 is provided over the first anode contact layer 16 (step 102). The first cathode layer 20 is provided over the first etch stop layer 18 (step 104). The first varactor layer 22 is provided over the first cathode layer 20 (step 106). The first anode contact layer 24 is provided over the first varactor layer 22 (step 108). The second etch stop layer 26 is provided over the first anode contact layer 24 (step 110). The second cathode contact layer 28 is provided over the second etch stop layer 26 (step 112). The third etch stop layer 30 is provided over the second cathode contact layer 28 (step 114). The second cathode layer 32 is provided over the third etch stop layer 30 (step 116). The second varactor layer 34 is provided over the second cathode layer 32 (step 118). The second anode contact layer 36 is provided over the second varactor layer (step 120). Any suitable epitaxial growth or deposition process may be used to provide the layers as described above without departing from the principles of the present disclosure.

Figure 8:
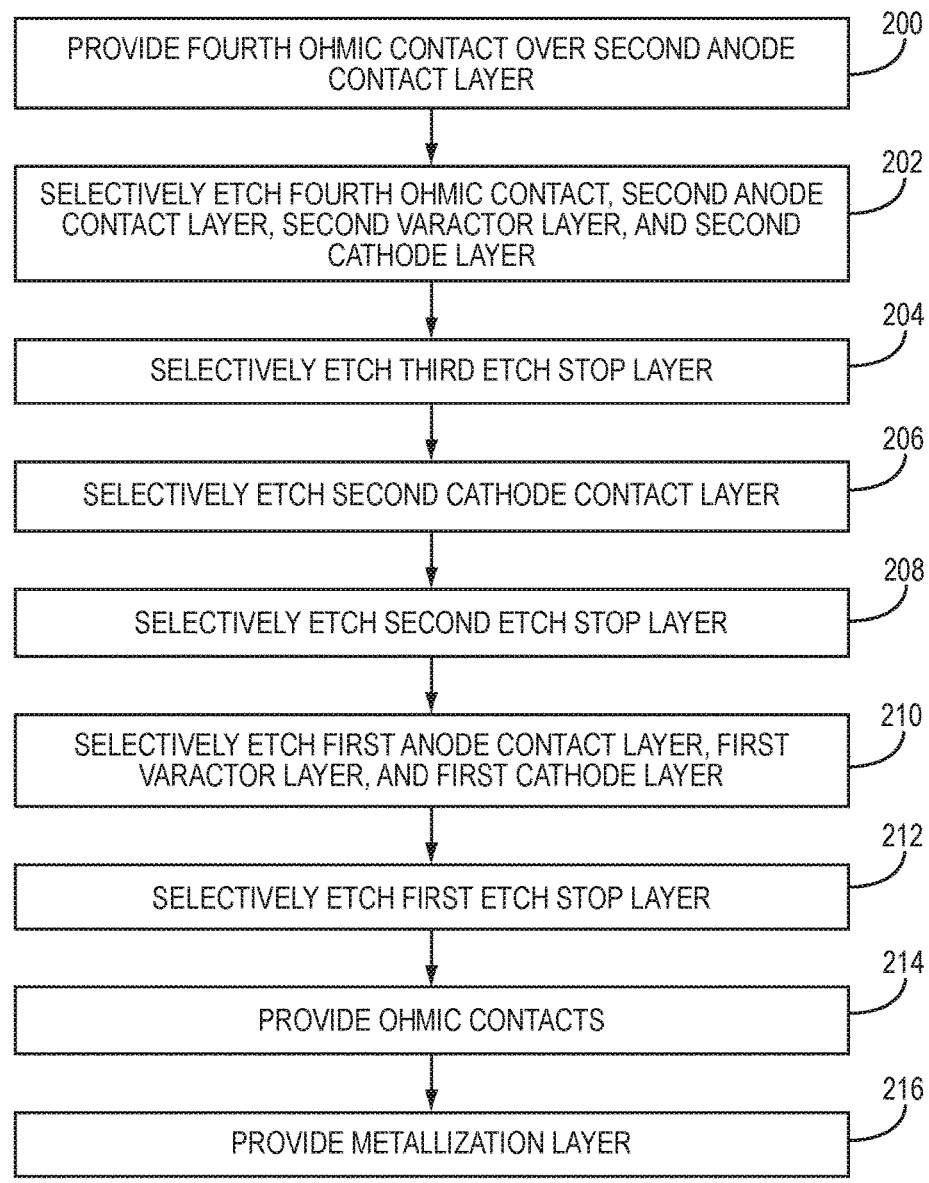
FIG. 8 is a flow diagram illustrating a method for manufacturing a dual-stack varactor from an epitaxial stack as shown in FIG. 7 according to one embodiment of the present disclosure.

FIG. 8 is a flow diagram illustrating a method for constructing the dual-stack varactor 14 discussed above with respect to FIG. 5 from the epitaxial stack described above with respect to FIG. 7. A similar process may be used to construct the dual-stack varactor 56 shown in FIG. 6. First, the fourth ohmic contact 52 is provided on the second anode contact layer 36 (step 200). The fourth ohmic contact 52, the second anode contact layer 36, the second varactor layer 34, and the second cathode layer 32 are then selectively etched using any number of masking and etching processes (step 202). Notably, the material of the third etch stop layer 30 is not compatible with the etching process used in step 202, and therefore the etching process does not affect the third etch stop layer 30. Accordingly, a separate etch process using a different etch process and/or chemistry is then used to selectively etch away the third etch stop layer 30 to form the fourth mesa 50 (step 204). Notably, the material of the second cathode contact layer 28 is not compatible with the etching process used in step 204, and therefore the etching process does not affect the second cathode contact layer 28. Accordingly, a separate etch process using a different etch process and/or chemistry is then used to selectively etch away the second cathode contact layer 28 (step 206). As discussed above, the second etch stop layer 26 is not affected by the etch process in step 206, and thus a separate etching process is used to selectively etch the second etch stop layer 26 to form the second mesa 46 (step 208). The first anode contact layer 24, the first varactor layer 22, and the first cathode layer 20 are then selectively etched (step 210). A separate etching process is then used to selectively etch the first etch stop layer 18 to form the first mesa 38 and the second mesa 42 (step 212). The first ohmic contact(s) 40, the second ohmic contact(s) 42, and the third ohmic contact(s) are then provided (step 214). Finally, the metallization layer 54 is provided (step 216). As will be appreciated by those of ordinary skill in the art, any number of masking and etching processes may be used to form the dual-stack varactor 14. All of these processes are contemplated herein.

Those skilled in the art will recognize improvements and modifications to the embodiments of the present disclosure. All such improvements and modifications are considered within the scope of the concepts disclosed herein and the claims that follow.

What is claimed is:

1. A semiconductor device comprising:
   a first varactor diode comprising a first plurality of epitaxial layers, wherein the first plurality of epitaxial layers comprises:
      a first cathode contact layer;
      a first cathode layer different from the first cathode contact layer and disposed over the first cathode contact layer;
      a first varactor layer over the first cathode layer;
      a first anode contact layer over the first varactor layer; and
      a first etch stop layer between the first cathode contact layer and the first cathode layer; and
   a second varactor diode coupled in series with the first varactor diode and comprising a second plurality of epitaxial layers, which are over the first plurality of epitaxial layers, wherein the second plurality of epitaxial layers comprises:
      a second cathode contact layer over the first anode contact layer;
      a second cathode layer different from the second cathode contact layer and disposed over the second cathode contact layer;
      a second varactor layer over the second cathode layer; and
      a second anode contact layer over the second varactor layer.

2. The semiconductor device of claim 1 wherein the first varactor diode further comprises:
   a first cathode contact on the first cathode contact layer; and
   a first anode contact on the first anode contact layer.

3. The semiconductor device of claim 2 wherein the second varactor diode further comprises:
   a second cathode contact on the second cathode contact layer; and
   a second anode contact on the second anode contact layer.

4. The semiconductor device of claim 3 further comprising a metallization layer connecting the first anode contact of the first varactor diode to the second cathode contact of the second varactor diode.

5. The semiconductor device of claim 4 further comprising:
   a second etch stop layer between the first anode contact layer and the second cathode contact layer; and
   a third etch stop layer between the second cathode contact layer and the second cathode layer.

6. The semiconductor device of claim 5 wherein:
   the first cathode contact layer forms a first mesa;
   the first etch stop layer, the first cathode layer, the first varactor layer, and the first anode contact layer form a second mesa over the first mesa;
   the second etch stop layer and the second cathode contact layer form a third mesa over the second mesa; and
   the third etch stop layer, the second cathode layer, the second varactor layer, and the second anode contact layer form a fourth mesa over the third mesa.

7. The semiconductor device of claim 6 wherein:
   the first cathode contact of the first varactor diode is an ohmic contact on the first mesa;
   the first anode contact of the first varactor diode is an ohmic contact on the second mesa;
   the second cathode contact of the second varactor diode is an ohmic contact on the third mesa; and
   the second anode contact of the second varactor diode is an ohmic contact on the fourth mesa.

8. The semiconductor device of claim 6 wherein:
   the first cathode contact layer, the first cathode layer, the first varactor layer, the first anode contact layer, the second cathode contact layer, the second cathode layer, the second varactor layer, and the second anode contact layer comprise gallium arsenide; and
   the first etch stop layer, the second etch stop layer, and the third etch stop layer comprise one of aluminum gallium arsenide and indium gallium phosphide.

* * * * *